United States Patent [19]

Ebeling et al.

[11] Patent Number: 5,208,491
[45] Date of Patent: May 4, 1993

[54] FIELD PROGRAMMABLE GATE ARRAY

[75] Inventors: William H. C. Ebeling; Gaetano Borriello, both of Seattle, Wash.

[73] Assignee: Washington Research Foundation, Seattle, Wash.

[21] Appl. No.: 817,697

[22] Filed: Jan. 7, 1992

[51] Int. Cl.$^5$ .................. H03K 19/173; H01L 25/00
[52] U.S. Cl. .............................. 307/465; 307/465.1
[58] Field of Search .............. 307/465, 465.1, 466–469

[56] References Cited

U.S. PATENT DOCUMENTS

| | | | |
|---|---|---|---|
| 4,642,487 | 2/1987 | CArter | 307/465 |
| 4,758,745 | 7/1988 | Elgamel et al. | 307/465 |
| 4,786,904 | 11/1988 | Graham, III et al. | 340/825.830 |
| 4,870,302 | 9/1989 | Freeman | 307/465 |
| 4,873,459 | 10/1989 | El Gamal et al. | 307/465 |
| 4,910,417 | 3/1990 | El Gamal et al. | 307/465 |
| 4,918,440 | 4/1990 | Furtek | 340/825.83 |
| 5,015,885 | 5/1991 | El Gamal et al. | 307/465 |
| 5,019,736 | 5/1991 | Furtek | 307/465 |
| 5,089,973 | 2/1992 | Furter | 307/465 |
| 5,132,571 | 7/1992 | McCollum | 307/465 |
| 5,144,166 | 9/1992 | Camarota et al. | 307/465 |

OTHER PUBLICATIONS

Concurrent Logic, Inc., "CFA6006 Field Programmable Gate Array", *Advanced Information* (Mar. 1991).
Furtek et al., "Labrinth: A Homogeneous Computational Medium," (May 1990).
Haines, Andrew, "Field-programmable gate array with non-volatile configuration,"*Microprocessors and Microsystems* (Jun. 1989).
Plessey Semiconductors, "ERA60100 Electrically Reconfigurable Array-ERA," *Advanced Information* (Nov. 1989).
XILINX, "The Programmable Gate Array Data Book," (1988).

Primary Examiner—Edward P. Westin
Assistant Examiner—Andrew Sanders
Attorney, Agent, or Firm—Christensen, O'Connor, Johnson & Kindness

[57] ABSTRACT

A field programmable gate array (FPGA) comprising routing and logic blocks (RLBs) and segmented routing channels is disclosed. Each RLB is configurable to perform both logic functions and routing functions. A plurality of forwardly propagating RLBs (FPRLBs) and a plurality of backwardly propagating RLBs (BPRLBs) intermesh with one another to form a two-dimensional checkerboard array. Each column of the RLB array comprises a plurality of FPRLBs and BPRLBs in alternating sequence. Similarly, each row of the RLB array comprises a plurality of FPRLBs and BPRLBs in alternating sequence. The FPRLBs forwardly propagate signals and the BPRLBs backwardly propagate signals. Each FPRLB may receive a plurality of input signals from a plurality of FPRLBs in the preceding leftward column. Moreover, each FPRLB may output a plurality of output signals to a plurality of FPRLBs in the next rightward column. Similarly, each BPRLB may receive a plurality of input signals from a plurality of BPRLBs in the preceding rightward column and transmit a plurality of output signals to a plurality of BPRLBs in the next leftward column. A plurality of vertical segmented routing channels are disposed between the columns of RLBs, the vertical segmented routing channels accessible to the input and output of adjacent columns of RLBs.

28 Claims, 8 Drawing Sheets

FIELD PROGRAMMABLE GATE ARRAY

FIELD OF THE INVENTION

The invention relates to a field programmable gate array and, more particularly, to a field programmable gate array having an interconnect structure that emulates the fan-in/fan-out structure of digital logic circuits.

BACKGROUND OF THE INVENTION

A digital logic circuit is a circuit that produces a digital output as a logical operation of digital inputs. By digital output and digital input, it is meant that the outputs and inputs are either one ("high") or zero ("low"). Generally, a digital logic circuit is formed as a cascade of separate logic functions. Examples of well known logic functions include AND, OR, NAND, and XOR. Complex digital logic circuits may comprise tens or hundreds of cascading logic functions. Digital logic circuits find use in many different applications. For example, digital logic circuits may be used in digital signal processing, in general computing applications, or as controllers for machinery.

Typically, digital logic circuits are implemented on an integrated semiconductor chip. However, a range of types of integrated chips are available for implementing digital logic circuits. One well-known type of integrated chip is the application specific integrated circuit (ASIC). ASICs, also known as custom integrated chips, are specifically manufactured to implement a particular digital logic circuit. One disadvantage of ASICs is the relatively high cost of design and manufacture.

Another type of integrated chip are programmable chips. Programmable chips differ from ASICs in that a single underlying integrated chip may be used to implement any number of different complex digital logic circuits by programming the underlying integrated chip. The programmable integrated chips are less costly because a large number of integrated chips may be manufactured from a single design. The same integrated chip may implement a variety of digital logic circuits. Thus, the cost of design and manufacture may be distributed over a large number of integrated chips. It is the programmable integrated chip that the present invention is directed towards.

The field programmable gate array (FPGA) is one type of programmable integrated chip. FPGAs are programmed in the field by the user. The programming may be accomplished using fuse programming technology or memory programming technology. For example, as is well known in the art, fuse programming involves the physical modification of the manufactured integrated chip so as to connect or disconnect elements in the integrated chip. Memory programming involves setting a plurality of memory bits on the integrated chip. The memory bits in turn control the connection of elements in the integrated chip. The advantage of memory programming is that the integrated chip may be reprogrammed.

An FPGA typically consists of an array of modularized logic blocks and interconnection resources. Each logic block can be programmed to implement a particular logic function. Signal propagation is accomplished by means of the interconnect resources. By programming a plurality of logic blocks to implement logic functions and utilizing the interconnect resources to propagate signals, a desired digital logic circuit can be implemented.

One area of considerable interest in FPGAs is the topology of the logic blocks and interconnect resources. Different topologies provide different performance characteristics. An important performance characteristic is the speed at which a signal can propagate through a logic circuit. Another important performance characteristic is the total amount of integrated chip space needed to implement a particular logic function.

FPGAs of the prior art typically use a topology whereby logic blocks are arranged in a two-dimensional array, consisting of a plurality of columns of logic blocks. Interconnect resources occupy the space between the columns and rows of the logic blocks. Illustrative is U.S. Pat. No. 4,870,302 to Freeman, which discloses an FPGA having a two-dimensional array of logic blocks. Horizontal and vertical interconnects occupy the area between the rows and columns of the logic blocks. Input/output devices are located at the periphery of the array to input and output signals into the FPGA. Additionally, each logic block is locally connected with the logic blocks above and below and to either side of the logic block. Signal propagation between logic blocks is accomplished using either the local interconnect structure or by utilizing the horizontal and vertical interconnects. The topology of Freeman allows for signal propagation from any one logic block to any other logic block via only the interconnect resources. This is referred to as point-to-point interconnectivity.

However, one difficulty with the FPGA topology of Freeman is that the horizontal and vertical interconnects may consume more than 95 percent of the chip area. The large amount of chip area dedicated to interconnect resources reduces the amount of chip area available for logic blocks, consequently reducing the complexity of digital logic circuits that can be implemented. Many digital logic circuits do not need the general point-to-point interconnect structure and for these circuits, the interconnect resources are wasted.

The present invention discloses a novel FPGA topology that minimizes the amount of integrated chip space needed to implement a digital logic circuit, while maintaining signal propagation speed.

SUMMARY OF THE INVENTION

A field programmable gate array (FPGA) comprising routing and logic blocks (RLBs) and vertical segmented routing channels is disclosed. The RLBS are categorized as either forwardly propagating RLBs (FPRLBs) or backwardly propagating RLBs (BPRLBs). The FPRLBs and BPRLBs intermesh with one another to form a two-dimensional checkerboard array. Thus, each column of the RLB array comprises a plurality of FPRLBs and BPRLBs in alternating sequence. Similarly each row of the RLB array comprises a plurality of FPRLBs and BPRLBs in alternating sequence.

The FPRLBs forwardly propagate signals, in a left to right direction. Each FPRLB may receive a plurality of input signals from a plurality of FPRLBs in the preceding leftward column. Moreover, each FPRLB may transmit a plurality of output signals to a plurality of FPRLBs in the next rightward column. Further, each FPRLB may receive input signals from and transmit output signals to the two BPRLBs in the same column and directly above and below the FPRLB.

Similarly, the BPRLBs backwardly propagate signals, in a right-to-left direction. Each BPRLB may receive a plurality of input signals from a plurality of BPRLBs in the preceding rightward column and transmit a plurality of output signals to a plurality of BPRLBs in the next leftward column. Each BPRLB may receive input signals from and transmit output signals to the two FPRLBs in the same column and directly above and below the BPRLB.

A plurality of vertical segmented routing channels (SRCs) serve as signal bus lines between RLBs. The segmented routing channels are categorized as either forwardly propagating SRCs (FPSRCs) or backwardly propagating SRCs (BPSRCs). One FPSRC and one BPSRC is disposed between adjacent columns of RLBs. Each FPRLB transmits an output signal to the immediately adjacent FPSRC to the right. Further, each FPRLB receives an input signal from the immediately adjacent FPSRC to the left. Similarly, each BPRLB transmits an output signal to the immediately adjacent BPSRC to the left. Each BPRLB also receives an input signal from the immediately adjacent BPSRC to the right.

In another embodiment of the present invention, the FPSRCs and BPSRCs are comprised of a plurality of individual bus lines. The bus lines are segmented into differing lengths, thereby allowing short range, medium range, and long range communication with other RLBs.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
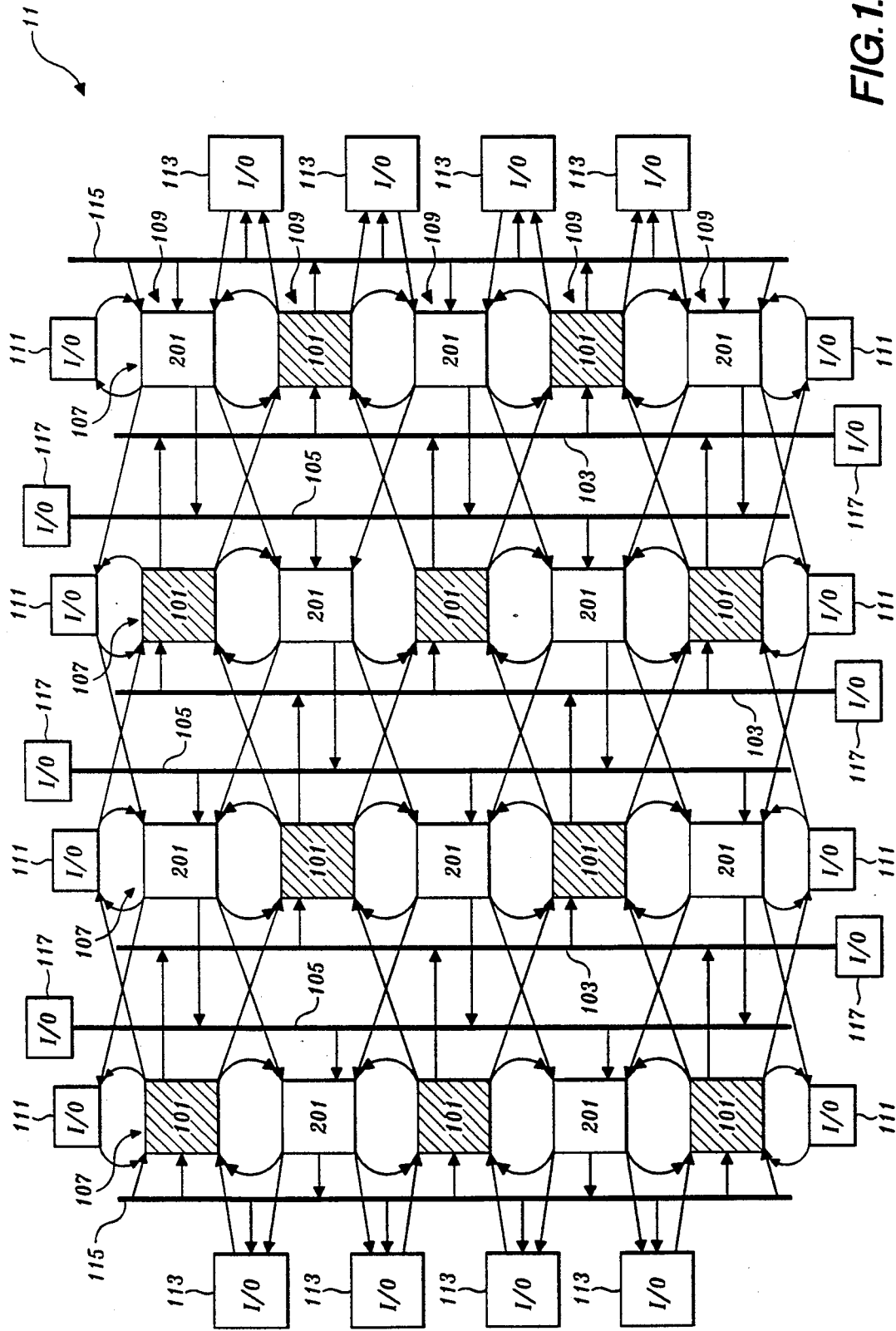
FIG. 1 illustrates the FPGA topology of the present invention.

Referring to FIG. 1, a field programmable gate array (FPGA) 11 comprises a plurality of routing and logic blocks (RLBs) 101 and 201, a plurality of forwardly propagating segmented routing channels (FPSRCs) 103, a plurality of backwardly propagating segmented routing channels (BPSRCs) 105, a plurality of top-bottom I/O pads 111, a plurality of side I/O pads 113, a plurality of routing channel I/O pads 117, and two side segmented routing channels 115.

FPGA 11 is an integrated circuit that can be programmed to implement an arbitrary digital logic circuit. A digital logic circuit is an electrical circuit that produces a digital output as a logic function of digital inputs. By digital output and digital input, it is meant that an output or input is either one ("high") or zero ("low"). The terms signal propagation, input signals, and output signals as used herein all refer to the propagation of signals that are digital in nature. Typically, a digital logic circuit is formed from a cascade of separate logic functions. Examples of digital logic functions are AND, OR, NAND, and XOR.

As will be seen with greater clarity below, each of the FPRLBs 101 and BPRLBs 201 include miltiplexers that must be programmed to output a selected signal from the plurality of signals presented. Moreover, a function block 305 of each RLB must be programmed so as to implement the desired logic function. Also, a plurality of tri-state buffers 315 included in each RLB must be programmed. As can be appreciated by those skilled in the art, the programmable elements have memory bits that are set by externally writing the information thereto. The method of programming a particular digital logic circuit is not of primary concern and various methods of accomplishing the same are known in the art.

The RLBs 101 and 201, although identical in internal structure, are categorized as either forwardly propagating RLBs (FPRLB) 101 or backwardly propagating RLBs (BPRLB) 201. As will be seen with greater clarity below, the FPRLBs 101 provide for signal flow in the forward direction. The term forward direction refers to signal propagation from left to right in FIG. 1. The BPRLBs 201 provide for signal flow in the backward direction. The term backward direction refers to signal propagation from right to left in FIG. 1. The combination of the FPRLBs 101 and the BPRLBs 201 allow for the implementation of digital logic circuits that require feedback.

Referring to FIG. 1, FPRLBs 101 and BPRLBs 201 are arranged in intermeshing fashion, and when taken together, form a two-dimensional checkerboard array of RLBs. Thus, each of the RLB columns 107 contain a plurality of FPRLBs 101 and BPRLBs 201 in alternating sequence. Similarly, each of the RLB rows 109 contain a plurality of FPRLBs 101 and BPRLBs 201 in alternating sequence. For clarity, only four columns and five rows of RLBs are shown in FIG. 1. However, in the preferred embodiment, the array consists of thirty-two rows and eight columns of RLBs. Further, it can be appreciated that the array may be extended to arbitrary size.

Disposed between each pair of adjacent columns of RLBs are FPSRCs 103 and BPSRCs 105. FPSRCs 103 and BPSRCs 105 provide routing channels for propagating signals between RLBs. Although both the FPSRCs 103 and BPSRCs 105 are shown in FIG. 1 as a single line, each FPSRC 103 and BPSRC 105 includes multiple separate bus lines. In the preferred embodiment, the FPSRCs 103 and the BPSRCs 105 include seven bus lines. As will be seen with greater clarity below, the seven bus lines provide for signal propagation between RLBs.

Neighbor Interconnect Structure of the FPRLBs

Figure 2:
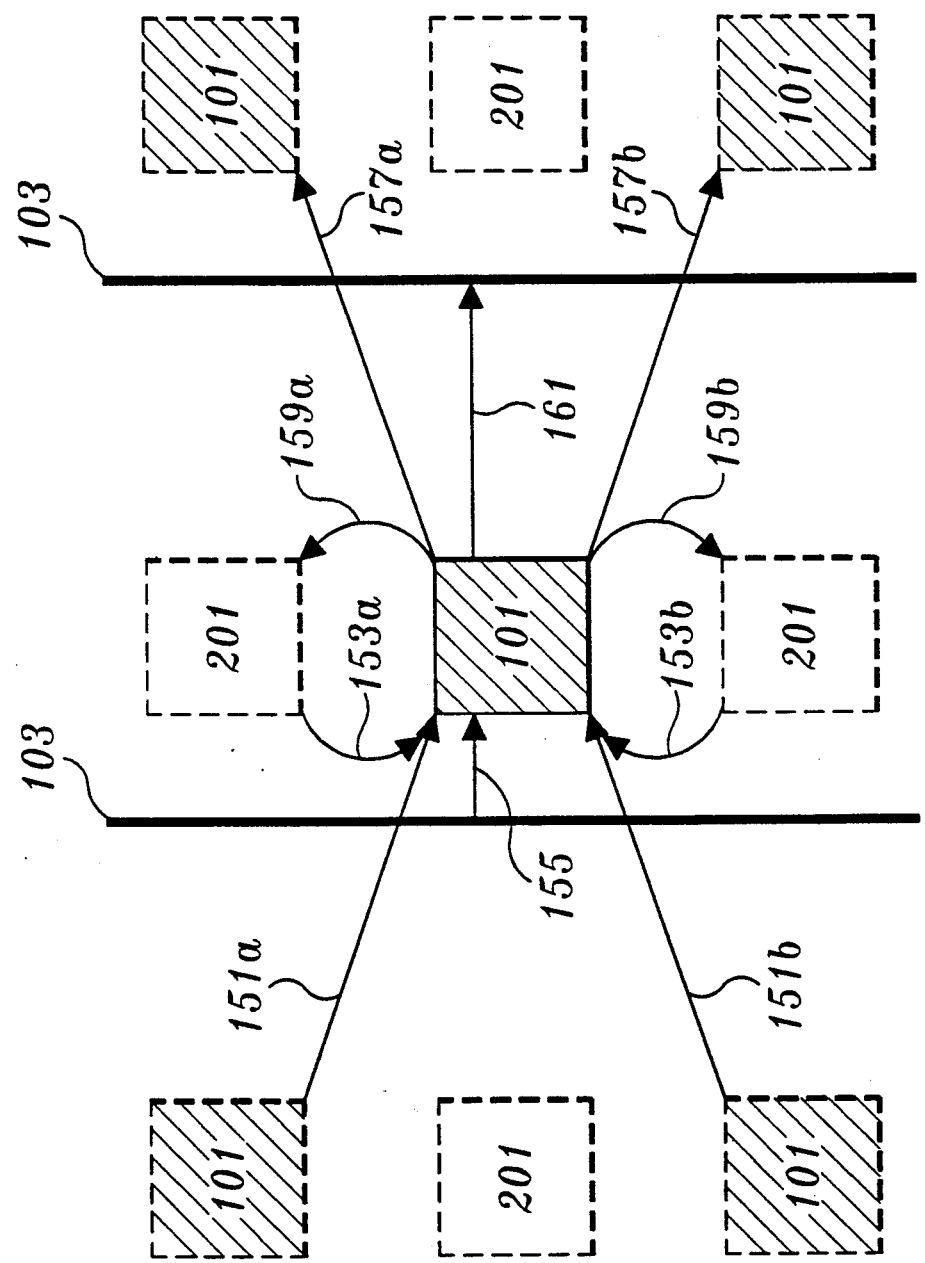
FIG. 2 illustrates the neighbor interconnect structure of a FPRLB.

Apart from the FPSRCs 103 and the BPSRCs 105, signal propagation to and from RLBs may also be carried out using a neighbor interconnect structure. Each RLB in the FPGA 11 has an associated neighbor interconnect structure. Referring to FIG. 2, an expanded schematic illustration of the FPGA topology of FIG. 1 is shown. As seen, the neighbor interconnect structure of a FPRLB 101 (shown in solid outline) comprises diagonal input interconnects 151a and 151b, vertical input interconnects 153a and 153b, FPSRC input interconnect 155, diagonal output interconnects 157a and 157b, vertical output interconnects 159a and 159b, and FPSRC output interconnect 161.

The neighbor interconnect structure allows each FPRLB 101 to receive input from five different sources. In particular, diagonal input interconnect 151a carries an input signal from the FPRLB 101 that is located in the immediately adjacent column to the left and in the immediately adjacent row above. Diagonal input interconnect 151b carries an input signal from the FPRLB 101 that is located in the immediately adjacent column to the left and in the immediately adjacent row below. Further, vertical input interconnect 153a carries an input signal from the BPRLB 201 in the same column and immediately above the FPRLB 101. Vertical input interconnect 153b carries an input signal from the BPRLB 201 in the same column and immediately below the FPRLB 101. Finally, FPSRC input interconnect 155 carries an input signal from the immediately adjacent FPSRC 103 to the left.

, As noted earlier, in the preferred embodiment, the FPSRC 103 comprises seven bus lines. The FPSRC input interconnect 155 accesses all seven of the bus lines. As will be seen below, a programmable multiplexer within each FPRLB allows the selection of one bus line to provide an input signal to the FPRLB. However, for clarity, each FPRLB 101 is shown as having a single FPSRC input interconnect 155. Thus, it can be appreciated that the single FPSRC input interconnect 155 is actually seven distinct interconnects, one to each bus line.

Each FPRLB 101 can supply three separate output signals to five separate destinations. In particular, diagonal output interconnect 157a carries a first output signal to the FPRLB 101 in the immediately adjacent column to the right and to the row above. The same first output signal is carried by vertical output interconnect 159a to the BPRLB 201 directly above in the same column. The second output signal is carried by diagonal output interconnect 157b to the FPRLB 101 in the immediately adjacent column to the right and to the row below. The same second output signal is carried by vertical output interconnect 159b to the BPRLB 201 directly below in the same column. Finally, the third output signal is carried by FPSRC output interconnect 161 to the immediately adjacent FPSRC 103 to the right.

More particularly, the FPSRC output interconnect 161 supplies the third output signal to all seven bus lines of FPSRC 103. Specifically, as will be seen below, the third output signal is provided to seven tri-state buffers 315 (seen in FIG. 4A) that act as a switch to control the output signal to the seven bus lines of the FPSRC 103. For clarity, each FPRLB 101 is shown as having a single FPSRC output interconnect 161. However, it can be appreciated that the single FPSRC output interconnect 161 is actually seven distinct interconnects, one to each of the seven bus lines.

The above description discloses that each FPRLB 101 has a neighbor interconnect structure comprised of diagonal input interconnects 151a and 151b, vertical input interconnects 153a and 153b, FPSRC input interconnect 155, diagonal output interconnects 157a and 157b, vertical output interconnects 159a and 159b, and a FPSRC output interconnect 161. However, because of the interconnection of the FPRLBs and the repetitive nature of the FPGA topology, the neighbor interconnect structure of a specific FPRLB 101 overlaps with the neighbor interconnect structure of other FPRLBs 101 and the neighbor interconnect structure of other BPRLBs 201. Specifically, the diagonal output interconnects 157 of one FPRLB are the diagonal input interconnects 151 of other FPRLBs 101. Similarly, the vertical output interconnects 159 of one FPRLB are the vertical input interconnects 173 of other BPRLBs 201.

Neighbor Interconnect Structure of the BPRLBs

Figure 3:
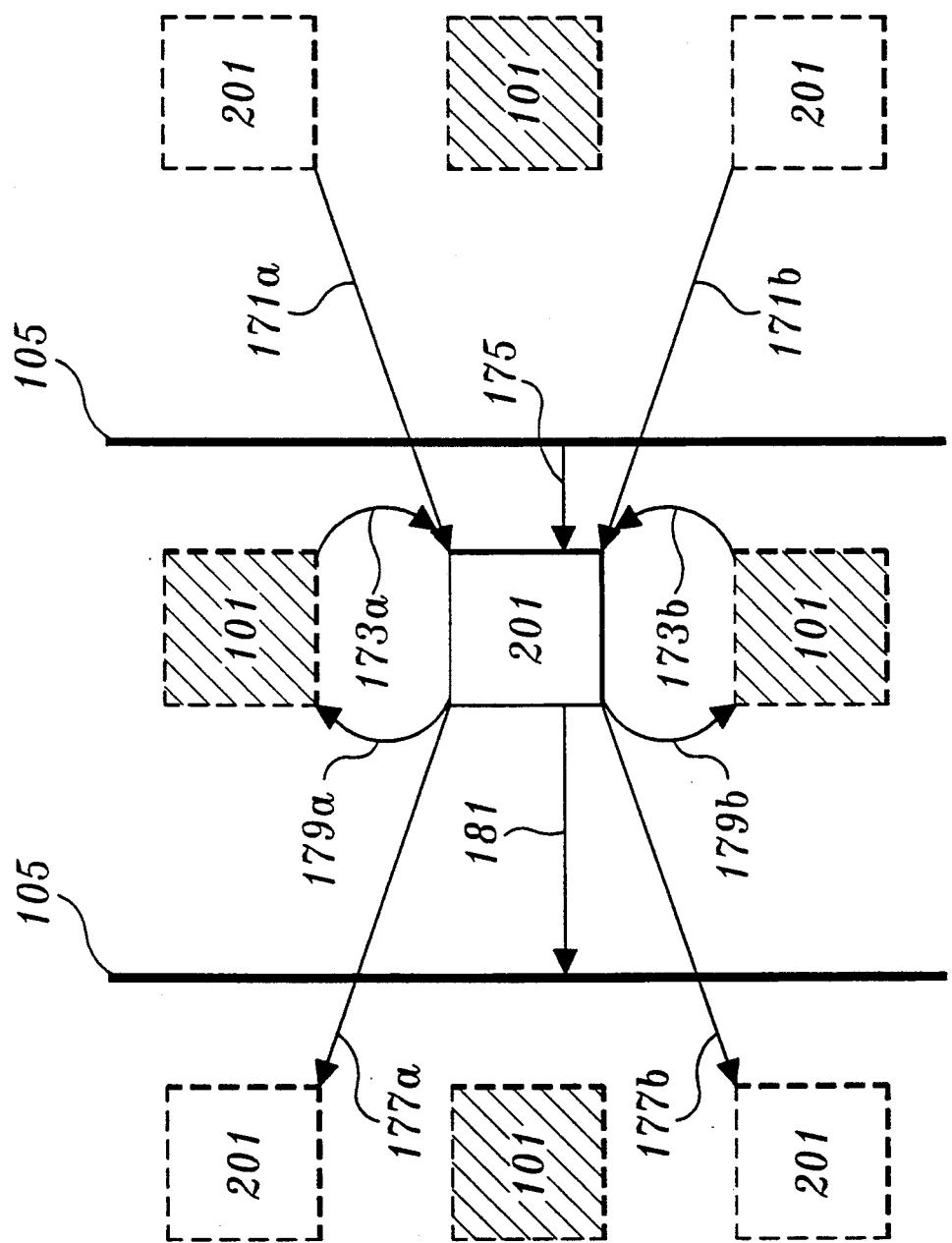
FIG. 3 illustrates the neighbor interconnect structure of a BPRLB.

The neighbor interconnect structure of the BPRLBs 201 is analogous to the neighbor interconnect structure of the FPRLBs 101. Referring to FIG. 3, a neighbor interconnect structure comprises diagonal input interconnects 171a and 171b, vertical input interconnects 173a and 173b, BPSRC input interconnect 175, diagonal output interconnects 177a and 177b, vertical output interconnects 179a and 179b, and BPSRC output interconnect 181.

The neighbor interconnect structure allows each BPRLB 201 to receive input from five different sources. In particular, diagonal input interconnect 171a carries an input signal from the BPRLB 201 that is located in the immediately adjacent column to the right and in the immediately adjacent row above. Also, diagonal input interconnect 171b carries an input signal from the BPRLB 201 that is located in the immediately adjacent column to the right and in the immediately adjacent row below. Further, vertical input interconnect 173a carries an input signal from the FPRLB 101 in the same column and immediately above the BPRLB 201. Vertical input interconnect 173b carries an input signal from the FPRLB 101 in the same column and immediately below the BPRLB 101. Finally, BPSRC input interconnect 175 carries an input signal from the immediately adjacent BPSRC 105 to the right.

Like the FPSRC 103, the BPSRC 105 comprises seven bus lines. The BPSRC input interconnect 175 accesses all seven of the bus lines. As will be seen below, a programmable multiplexer within each BPRLB allows the selection of one bus line to provide an input signal to the BPRLB. However, for clarity, each BPRLB 201 is shown as having a single BPSRC input interconnect 175. Thus, it can be appreciated that the single BPSRC input interconnect 175 is actually seven distinct interconnects, one to each bus line.

Each BPRLB 201 can supply three separate output signals to five separate destinations. In particular, diagonal output interconnect 177a carries a first output signal to the BPRLB 201 in the immediately adjacent column to the left and to the row above. The same first output signal is carried by vertical output interconnect 179a to the FPRLB 101 directly above in the same column. The second output signal is carried by diagonal output interconnect 177b to the BPRLB 201 in the immediately adjacent column to the left and to the row below. The same second output signal is carried by vertical output interconnect 179b to the FPRLB 101 directly below in the same column. Finally, the third output signal is carried by BPSRC output interconnect 181 to the immediately adjacent BPSRC 105 to the right.

The BPSRC output interconnect 181 supplies the third output signal to the seven bus lines of BPSRC 105. Specifically, as will be seen below, the third output signal is provided to seven tri-state buffers 315 that act as a switch to control the output signal to the seven bus lines of the BPSRC 105. For clarity, each BPRLB 201 is shown as having a single BPSRC output interconnect 181. However, it can be appreciated that the single BPSRC output interconnect 181 is actually seven distinct interconnects, one to each of the seven bus lines.

The above description discloses that each BPRLB 201 has a neighbor interconnect structure comprised of diagonal input interconnects 171a and 171b, vertical input interconnects 173a and 173b, BPSRC input interconnect 175, diagonal output interconnects 177a and 177b, vertical output interconnects 179a and 179b, and a BPSRC output interconnect 181. However, because of the interconnection of the BPRLBs and the repetitive nature of the FPGA topology, the neighbor interconnect structure of a specific BPRLB 201 overlaps with the neighbor interconnect structure of other BPRLBs 201 and the neighbor interconnect structure of other FPRLBs 101. Specifically, the diagonal output interconnects 177 of one BPRLB are the diagonal input interconnects 171 of other BPRLBs 201. Similarly, the vertical output interconnects 179 of one BPRLB are the vertical input interconnects 153 of other FPRLBs 101.

Internal Structure of a RLB

Figure 4A:
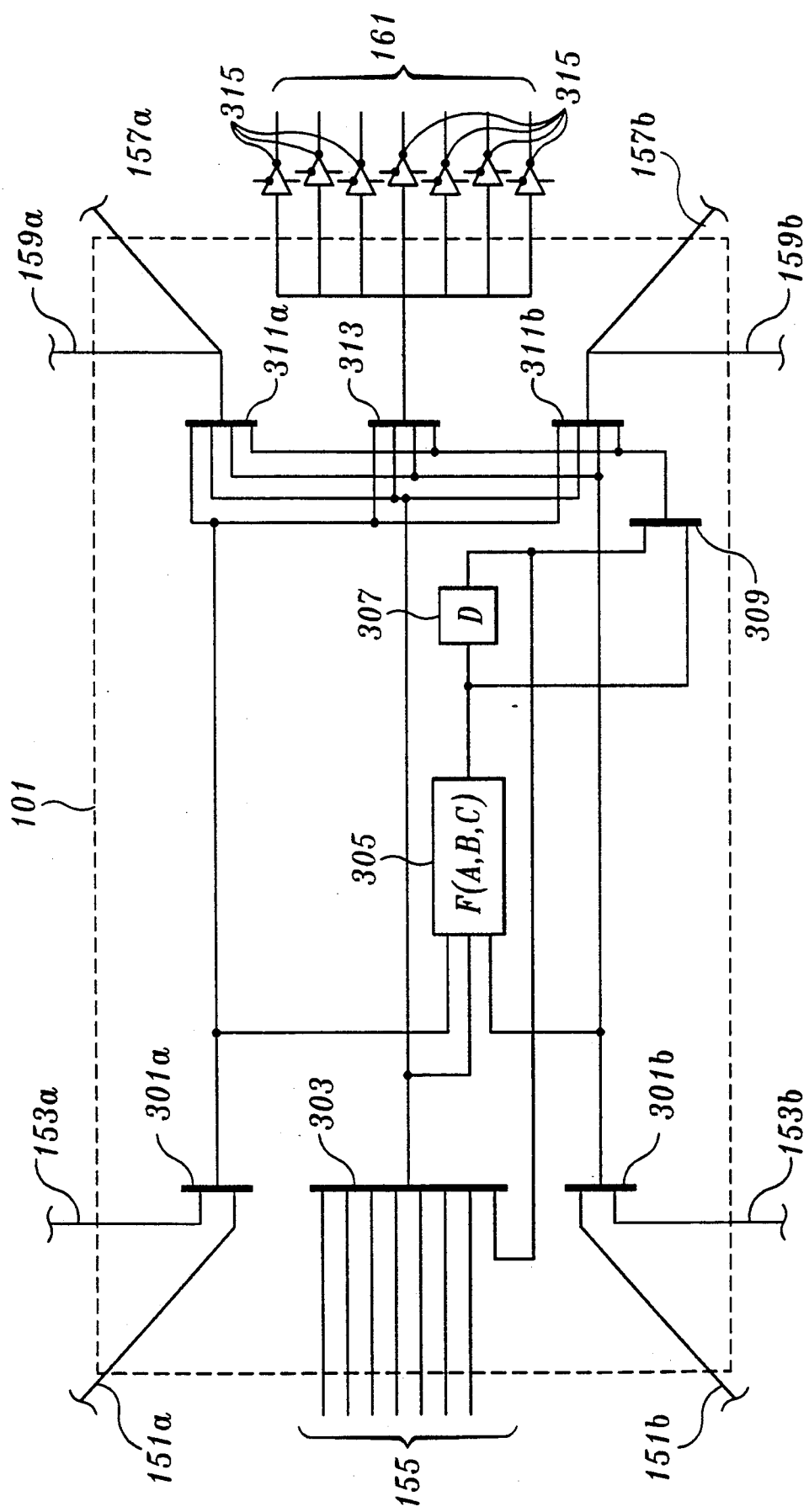
FIG. 4A is a schematic representation of the internal structure of a routing and logic block.

Referring to FIG. 4A, a schematic block diagram illustrating the internal structure of the preferred embodiment of the FPRLBs and the BPRLBs is shown. As noted earlier, both the FPRLBs and the BPRLBs have an identical internal structure. An FPRLB will be described in detail with reference to FIG. 4A. However, it can be appreciated that the BPRLBs are identically formed. The FPRLB 101 is comprised of two FPRLB input multiplexers 301a and 301b, an input routing channel multiplexer 303, a function block 305, a master-slave latch 307, a latch multiplexer 309, two RLB output multiplexers 311a and 311b, and an output routing channel multiplexer 313. The multiplexers 301a, 301b, 303, 309, 311a, 311b, and 313 are programmable elements that are operative to allow one signal to pass therethrough from a plurality of input signals presented.

In particular, each of the two FPRLB input multiplexers 301a and 301b has two input signals. One input signal of FPRLB input multiplexer 301a is carried by the diagonal input interconnect 151a (shown in FIG. 2). The diagonal input interconnect 151a carries an input signal from the FPRLB in the immediately adjacent leftward column and in the row above. The other input signal of input multiplexer 301a is carried by the vertical input interconnect 153a. The vertical input interconnect 153a carries an input signal from the BPRLB 201 in the same column and immediately above as the FPRLB. Input multiplexer 301a is programmable to select one of the two inputs to pass therethrough for further processing. As seen, the signal passed by RLB input multiplexer 301a is provided to function block 305, RLB output multiplexers 311a and 311b, and output routing channel multiplexer 313.

Similarly, one input signal of FPRLB input multiplexer 301b is carried by the diagonal input interconnect 151b (shown in FIG. 2). The diagonal input interconnect 151b carries an input signal from the FPRLB in the immediately adjacent leftward column and in the row below. The other input signal of input multiplexer 301b is carried by the vertical input interconnect 153b. The vertical input interconnect 153b carries an input signal from the BPRLB 201 in the same column and immediately below as the FPRLB. Input multiplexer 301b is programmable to select one of the two inputs to pass therethrough for further processing. As seen, the signal passed by RLB input multiplexer 301b is provided to function block 305, RLB output multiplexers 311a and 311b, and output routing channel multiplexer 313.

Next, input routing channel multiplexer 303 has eight inputs. The input routing channel multiplexer 303 accepts input signals provided by the FPSRC 103 adjacent and to the left of the FPRLB 101. The FPSRC 103 is comprised of seven individual bus lines. One input signal from each bus line is carried by input interconnect 155 to input routing channel multiplexer 303. The eighth input, as seen in FIG. 4A, is provided as a feedback signal from master-slave latch 307. Input routing channel multiplexer 303 is programmable to select any one of the eight inputs to pass therethrough for further processing. As seen, the signal passed by input routing channel multiplexer 303 is provided to function block 305, RLB output multiplexers 311a and 311b, and output routing channel multiplexer 313.

In sum, the operation of the multiplexers 301a, 301b, and 303 provide three input signals, respectively, to function block 305. The first input signal is either the input signal carried on diagonal input interconnect 151a or the input signal carried on vertical input interconnect 153a. The second input signal is either the input signal carried on diagonal input interconnect 151b or the input signal carried on vertical input interconnect 153b. The third input signal is either one of the input signals carried by the seven bus lines of FPSRC 103 or the feedback signal from master-slave latch 307.

Function block 305 can provide an output based upon a logic function of the input signals provided. Examples of logic functions that function block 305 may implement are AND, OR, NAND, and XOR. It can be appreciated that function block 305 is a generalized functional element that can implement any logic function of three inputs. Integrated circuit implementations of function block 305 are well known in the art and the reader is directed to Machart et al., *General Function Circuit*, IBM T.D.B., Vol. 15, No. 1, June 1972, p. 11; and Gamblin et al., *Thin Film Universal Logic Block*, IBM T.D.B., Vol. 9, No. 6, November 1966, pp. 662-664 for further information.

The output of function block 305 is sampled by master-slave latch 307. Although not shown, a global clock signal is provided to each FPRLB 101 and BPRLB 201 externally from a clock source. As can be appreciated by those skilled in the art, the global clock signal is used by the master-slave latch 307 to sample the output of the function block 305 at a specific time. Master-slave latch 307 stores the sampled output of the function block 305 for one clock period. The master-slave latch 307 is utilized to implement synchronous sequential circuits that require memory.

The output of function block 305 is also provided to latch multiplexer 309. Latch multiplexer 309 is programmable to select and output either the output of function block 305 or the output of master-slave latch 307. The output of latch multiplexer 309 is provided as an input to RLB output multiplexers 311a and 311b and output routing channel multiplexer 313. Moreover, as noted earlier, the output of master-slave latch 307 is provided as an input to input routing channel multiplexer 303.

Thus, FPRLB output multiplexer 311a has as input signals the outputs of input multiplexers 301a, 301b, and 303. The output multiplexer 311a also has as an input signal the output of latch multiplexer 309. Output multiplexer 311a is programmable to select and output any one of the signals presented. Similarly, FPRLB output multiplexer 311b has as input signals the outputs of input multiplexers 301a, 301b, and 303. The output multiplexer 311b also has as an input signal the output of latch multiplexer 309. Output multiplexer 311b is also programmable to select and output any one of the signals presented. Finally, output routing channel multiplexer 313 has as input signals the outputs of input multiplexers 301a, 301b, and 303. The output routing channel multiplexer 313 also has as an input signal the output of latch multiplexer 309. Output routing channel multiplexer 313 is also programmable to select and output any one of the signals presented.

The output of output routing channel multiplexer 313 is provided to FPSRC 103. As noted, the FPSRCs 103 and the BPSRCs 105 include seven bus lines. By the use of seven tri-state buffers 315, the output of output routing channel multiplexer 313 may be selectively applied to each of the seven bus lines. In particular, the tri-state buffers 315 act as a driver that either transmits a signal or does not transmit a signal onto the bus line.

In sum, it can be seen that three separate output signals are provided by FPRLB 101, two by RLB output multiplexers 311a and 311b, and one by output routing channel multiplexer 313. The first output signal provided by RLB output multiplexer 311a is provided to diagonal output interconnect 157a and to vertical output interconnect 159a. The second output signal provided by RLB output multiplexer 311b is provided to diagonal output interconnect 157b and to vertical output interconnect 159b. The third output signal provided by output routing channel multiplexer 313 is provided to the seven bus lines of FPSRC 103.

Figure 4B:
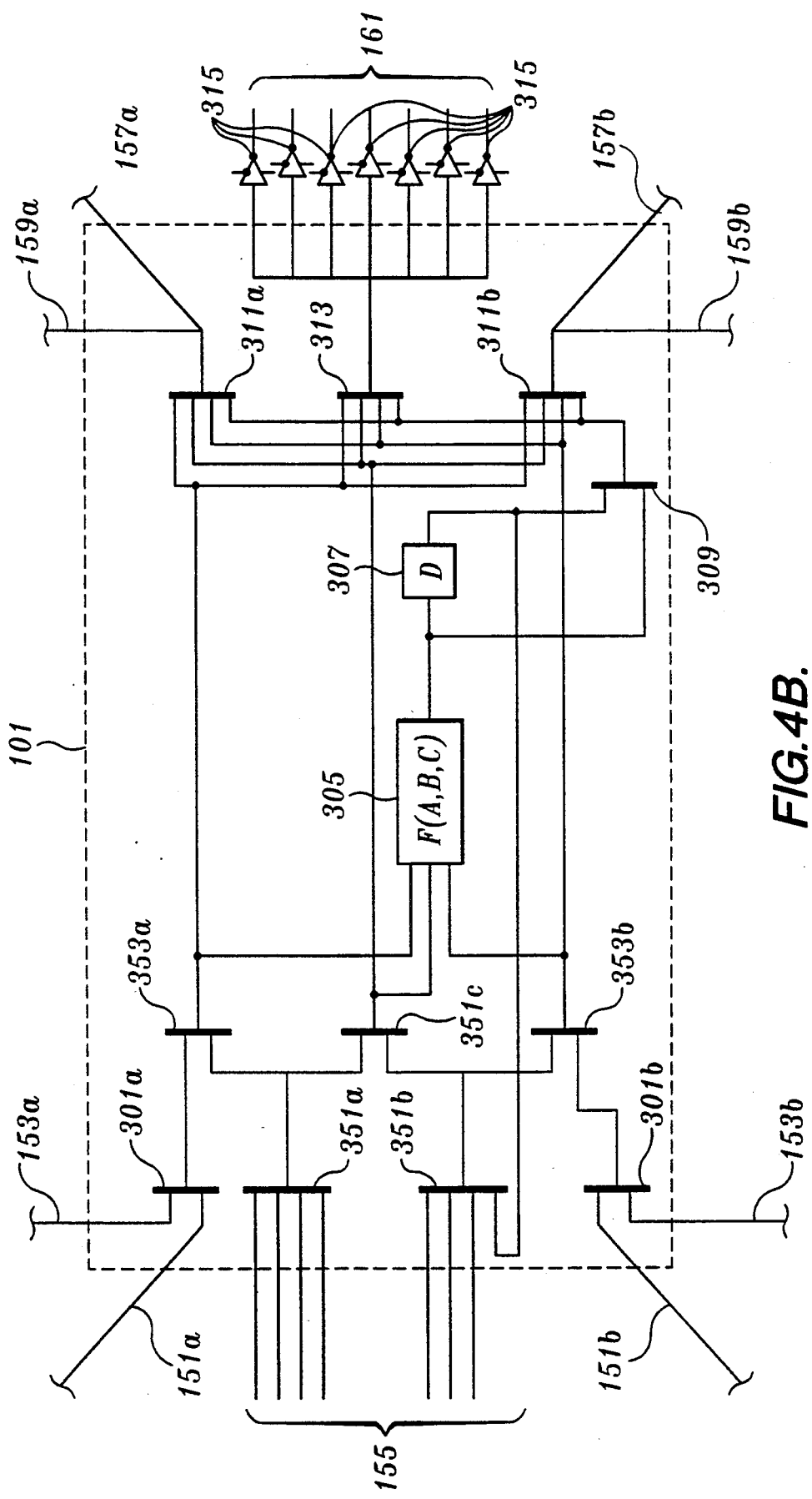
FIG. 4B is a schematic representation of an alternative embodiment of a routing and logic block.

FIG. 4B shows an alternative embodiment of the RLBs, whereby improved routing flexibility is provided by including additional multiplexers at the input stage of the FPRLB 101. Specifically, FPSRC input multiplexers 351a, 351b, and 351c allow function block 305 to receive two inputs from the FPSRC input interconnect 155. Secondary multiplexers 353a and 353b are operative to provide further routing flexibility. In particular, secondary multiplexer 353a provides an output from either the FPSRC input interconnect 155, from the vertical input interconnect 153a, or the diagonal input interconnect 151a. Similarly, secondary multiplexer 353b provides an output from either the FPSRC input interconnect 155, from the vertical input interconnect 153b, or the diagonal input interconnect 151b. The outputs of both secondary multiplexers 353a and 353b can be routed to function block 305 or any of the output multiplexers 311a, 311b, or 313. It can be appreciated that further combinations of multiplexers may be included in the FPRLB 101 to provide for a variety of routing structures.

In either embodiment, the RLBs are capable of performing both function calculation and routing tasks simultaneously. For example, returning to FIG. 4A, an input signal carried on diagonal input interconnect 151a may be routed, by appropriate programming of the multiplexers, to the two BPRLBs in the same column directly above and below via vertical output interconnects 159a and 159b, to the two FPRLBs in the next rightward column and in the row above and below via diagonal output interconnects 157a and 157b, or to more distant FPRLBs in the next rightward column by means of the FPSRC 103.

Figure 5A:
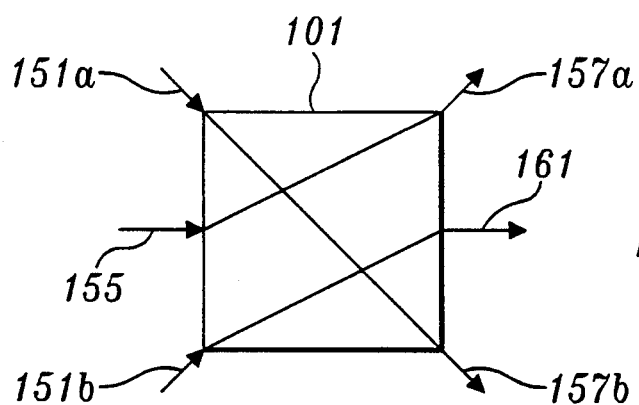
FIGS. 5A–5D illustrate several possible configurations for a routing and logic block.
Figure 5B:
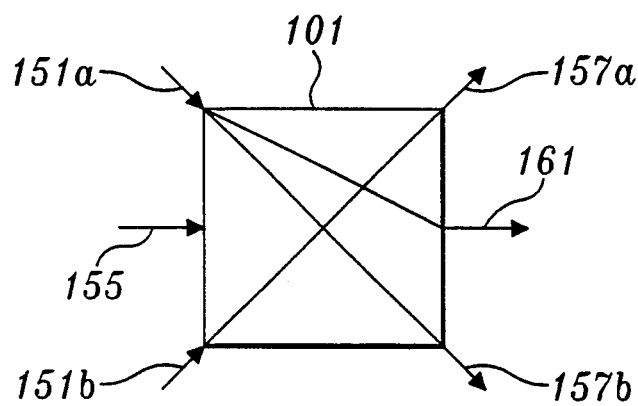

The routing flexibility leads to several possible uses for a RLB, as seen in FIGS. 5A-5D. In FIGS. 5A and 5B, the RLB may be used exclusively for routing purposes. Specifically, in FIG. 5A, an input signal provided via diagonal input interconnect 151a is routed as an output signal via diagonal output interconnect 157b. An input signal provided via FPSRC input interconnect 155 is routed to diagonal output interconnect 157a. Finally, an input signal provided by diagonal input interconnect 151b is routed as an output signal via FPSRC output interconnect 161. The internal structure of the RLBs provide for routing of input signals provided by the input interconnects to the output interconnects in numerous combinations. Moreover, a single input signal received may be routed to a plurality of output interconnects, as seen in FIG. 5B.

Figure 5C:
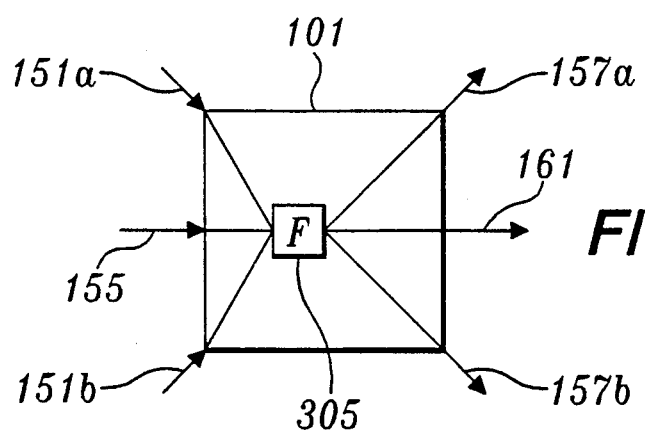
Figure 5D:
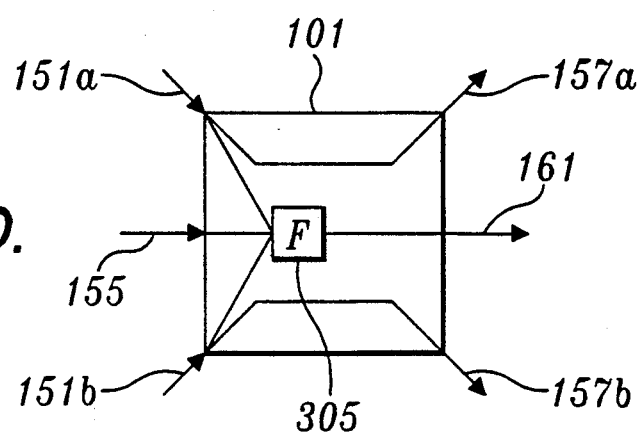

FIG. 5C and 5D shows an RLB being used as a logic function and as a routing block. Specifically, in FIG. 5C, the function block 305 calculates a logic function of three inputs, provided by the input interconnects 151a, 151b, and 155. The output of the function block 305 is provided to output interconnects 157a, 157b, and 161. Finally, in FIG. 5D shows another variation in RLB signal propagation where the RLB is used for both routing and logic function calculation.

Segmented Routing Channel Structure

Figure 6:
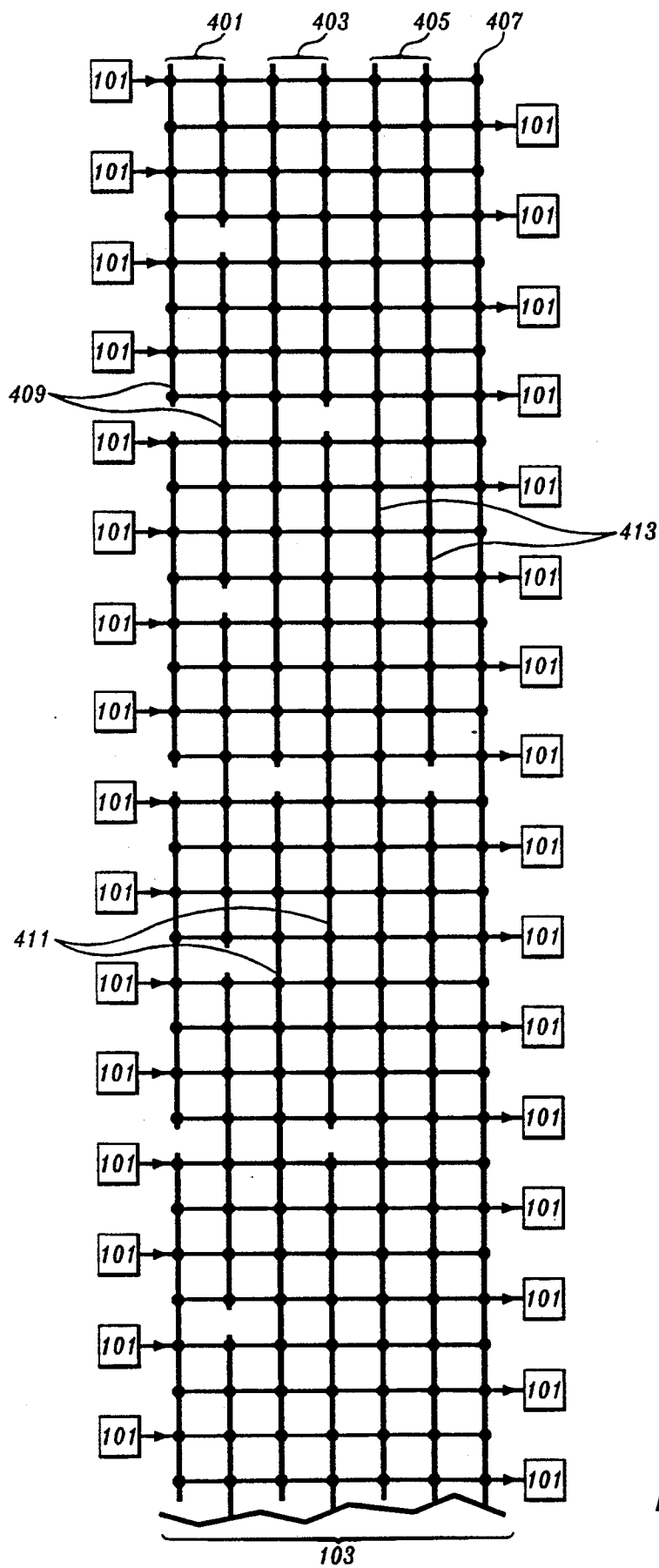
FIG. 6 illustrates the connection of the FPRLBs in two adjacent columns to a vertical segmented routing channel.

FIG. 6 illustrates in greater detail the structure of the FPSRC 103. For clarity, the BPRLBs 201 are omitted as is the BPSRC 105. In the preferred embodiment, the FPSRC 103 is comprised of seven distinct bus lines. Two of the bus lines are short bus lines 401. Each short bus line 401 is segmented into electrically isolated short segments 409 that are connected to eight FPRLBs 101. Two of the bus lines are medium bus lines 403. Each medium bus line 403 is segmented into electrically isolated medium segments 411 that are connected to sixteen FPRLBs 101. Two of the bus lines are long bus lines 405. Each long bus line 405 is segmented into electrically isolated long segments 413 that are connected to thirty-two FPRLBs 101. Finally, the last bus line is a global bus line 407 that is continuous throughout its length and connects to all FPRLBs 101 in the adjacent columns.

As seen in FIG. 6, each short segment 409 of a first short bus line 401 has connected thereto eight FPRLBs 101, four consecutive FPRLBs 101 from the column to the left and four consecutive FPRLBs 101 from the column to the right. Thus, in operation, one of the four consecutive FPRLBs 101 in the left column may provide an output signal onto the short segment 409. The four consecutive FPRLBs 101 in the column to the right may access the output signal provided.

Moreover, the second short bus line 401 has short segments 409 that are vertically offset from the short segments 409 in the first bus line 401. The vertical offset is equal to one-half of the length of short segment 409. Thus, short segments 409 in adjacent bus lines 401 are commonly connected to four FPRLBs 101.

Each medium segment 411 of a first medium bus line 403 has connected thereto sixteen FPRLBs 101, eight consecutive FPRLBs 101 from the column to the left and eight consecutive FPRLBs 101 from the column to the right. Thus, in operation, one of the eight consecutive FPRLBs 101 in the left column may provide an output signal onto the medium segment 411. The eight consecutive FPRLBs 101 in the column to the right may access the output signal provided.

Moreover, the second medium bus line 403 has medium segments 411 that are vertically offset from the medium segments 411 in the first medium bus line 403. The vertical offset is equal to one-half of the length of medium segment 411. Thus, medium segments 411 in adjacent medium bus lines 403 are commonly connected to eight FPRLBs 101.

Each long segment 413 of a first long bus line 405 has connected thereto thirty-two FPRLBs 101, sixteen consecutive FPRLBs 101 from the column to the left and sixteen consecutive FPRLBs 101 from the column to the right. Thus, in operation, one of the sixteen consecutive FPRLBs 101 in the left column may provide an output signal onto the long segment 413. The sixteen consecutive FPRLBs 101 in the column to the right may access the output signal provided.

Moreover, the second long bus line 405 has long segments 413 that are vertically offset from the long segments 413 in the first long bus line 405. The vertical offset is equal to one-half of the length of long segment 413. Thus, long segments 413 in adjacent long bus lines 405 are commonly connected to sixteen FPRLBs 101.

The global bus line 407 spans the entire length of the FPGA columns 107. Each FPRLB 101 in the adjacent columns are connected to the global bus line 405. Thus, in operation, one of the FPRLBs 101 in the left column may provide an output signal onto the global bus line 407. The FPRLBs 101 in the column to the right or routing channel I/O pad 117 may then access the output signal provided. Further, as will be seen below, routing channel I/O pad 117 may provide an input signal onto the global bus line 407 for access by the FPRLBs 101 in the column to the right.

The operation of FPSRCs 103 is to provide communication from each FPRLB 101 to the FPRLBs 101 in the adjacent right column. The communication may be accomplished via the short segments 409, the medium segments 411, the long segments 413, or the global bus line 407.

Although FIG. 6 illustrates only a FPSRC 103, the BPSRCs 105 are of identical configuration. Thus, the BPSRC 103 is also comprised of seven distinct bus lines. Two of the bus lines are short bus lines, segmented into electrically isolated short segments that connect to eight BPRLBs 201. Two of the bus lines are medium bus lines, segmented into electrically isolated medium segments that connect to sixteen BPRLBs 201. Two of the bus lines are long bus lines, segmented into electrically isolated long segments that connected to thirty-two RLBs 201. Finally, a continuous global bus line connects to all BPRLBs 201 for use as a signal path.

Each short segment has connected thereto eight BPRLBs 201, four from the column to the left and four from the column to the right. Moreover, adjacent short bus lines are vertically offset from one another by one-half of the length of short segment. Thus, adjacent short segments in adjacent bus lines are commonly connected to four BPRLBs. Similarly, each medium segment has connected thereto sixteen BPRLBs 201, eight from the column to the left and eight from the column to the right. Moreover, adjacent medium bus lines are vertically offset from one another by one-half of the length of medium segment. Also, each long segment has connected thereto thirty-two BPRLBs 201, sixteen from the column to the left and sixteen from the column to the right. Moreover, adjacent medium bus lines are vertically offset from one another by one-half of the length of medium segment.

The operation of BPSRCs 105 is to provide communication from each BPRLB 201 to the BPRLBs 201 in the adjacent left column. The communication may be accomplished via the short segments, the medium segments, the long segments, or the global bus line 407.

Figure 7:
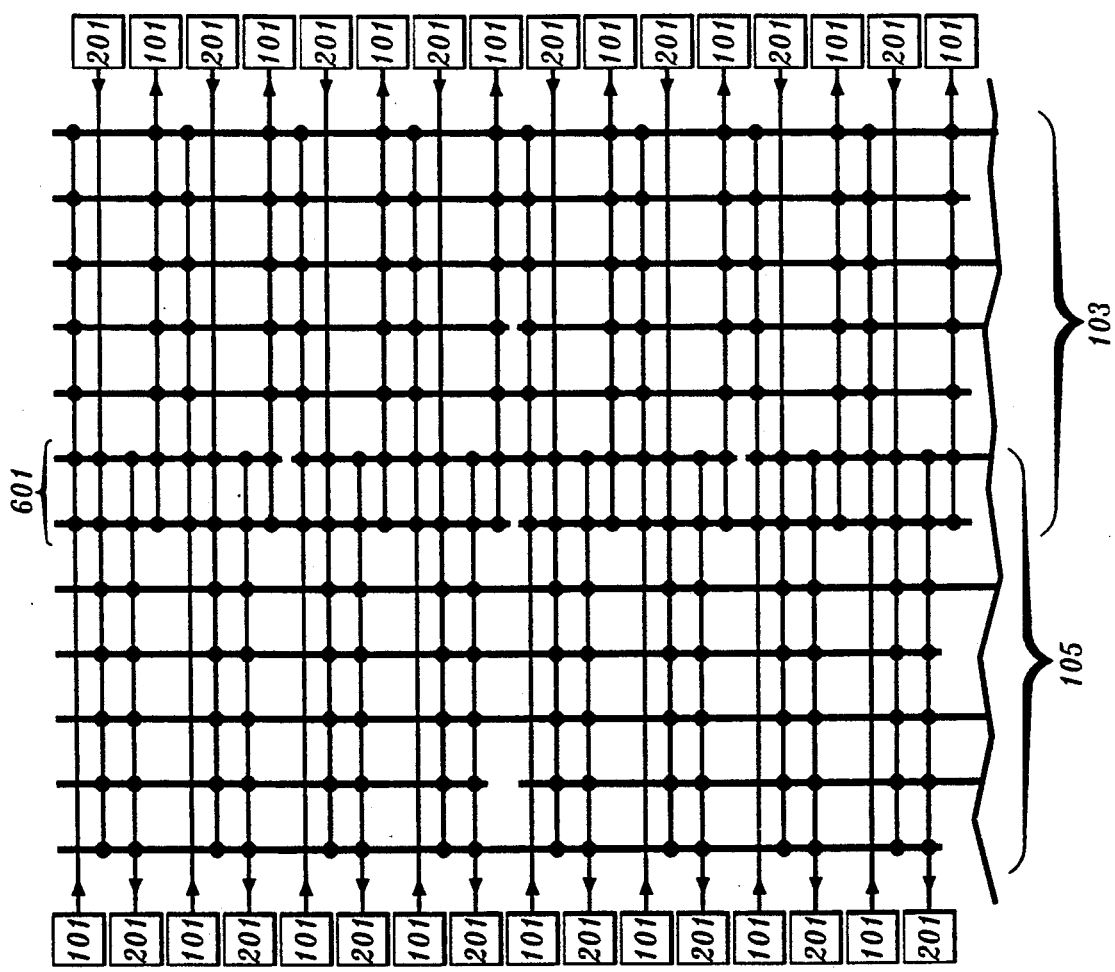
FIG. 7 illustrates an alternative embodiment of the FPGA where the FPSRC and the BPSRC share common bus lines.

In an alternative embodiment, as seen in FIG. 7, the FPSRC 103 and BPSRC 105 between the RLB columns 107 may share certain bus lines. FIG. 7 shows a portion of adjacent RLB columns 107. As seen, BPSRC 105 and FPSRC 105 share two short bus lines 601. By sharing, it is meant that all connections from the FPRLBs 101 to the short bus lines 401 of the FPSRC 103 and all connections from the BPRLBs 201 to the short bus lines of the BPSRCs 105 are connected to a single pair of shared short bus lines 601. Shared short bus lines 601 are thus connected to sixteen RLBs: four FPRLBs from the left column, four FPRLBs from the right column, four BPRLBs from the left column, and four BPRLBs from the right column. In other variations, the shared bus lines may be the medium bus lines or the long bus lines or any combination thereof.

It can be appreciated by those skilled in the art that the FPSRCs 103 and the BPSRCs 105 may be configured in a multitude of different arrangements. For example, the FPSRCs 103 and the BPSRCs may include any number of separate bus lines. Furthermore, the length of the segments of the bus lines 401, 403, and 405 may be different from the preferred lengths described above. Thus, the description given above with respect to the FPSRCs 103 and the BPSRCs 105 should not be construed as limiting.

Providing Input Signals to the FPGA

Returning to FIG. 1, input signals are provided to and output signals are extracted from the FPGA 11 via top-bottom I/O pads 111, routing channel I/O pads 117, and side I/O pads 113. As seen, side I/O pads 113 are disposed along both side peripheries of the FPGA 11, between the RLB rows 109. In particular, the side I/O pads 113 at the left periphery of the FPGA 11 are programmable to provide input signals to the diagonal input interconnects 151a and 151b of the FPRLBs 101. Side I/O pads 113 at the left periphery of the FPGA 11 are also programmable to receive output signals from the diagonal output interconnects 177a and 177b of the BPRLBs 201. Furthermore, the side I/O pads 113 at the left periphery of the FPGA 11 are programmable to receive output signals from the side segmented routing channel 115.

Similarly, the side I/O pads 113 at the right periphery of the FPGA 11 are programmable to provide input signals to the diagonal input interconnects 171a and 171b of the BPRLBs 201. Side I/O pads 113 at the right periphery of the FPGA 11 also are programmable to receive output signals from the diagonal output interconnects 157a and 157b of the FPRLBs 101. Further, the side I/O pads 113 at the right periphery of the FPGA 11 are programmable to receive output signals from the side segmented routing channel 115.

In the preferred embodiment, as seen in FIG. 1, top-bottom I/O pads 111 are disposed generally along the top and bottom edges of the FPGA 11, directly above or below the RLB columns 107, respectively. The top-bottom I/O pads 111 along the top periphery of the FPGA 11 are programmable to provide an input signal to the RLB directly below the top-bottom I/O pad 111. The same input signal is provided to the RLB in the top row of the two adjacent RLB column 107. Moreover, the top-bottom I/O pads 111 along the top periphery of the FPGA 11 are programmable to receive an output signal from the RLB directly below the top-bottom I/O pad 111. Another output signal is received from the RLB in the top row of the other adjacent RLB column 107.

The top-bottom I/O pads 111 along the bottom periphery of the FPGA 11 are programmable to provide an input signal to the RLB directly above the top-bottom I/O pad 111. The same input signal is provided to the RLB in the bottom row of one of the two adjacent RLB column 107. Moreover, the top-bottom I/O pads 111 along the bottom periphery of the FPGA 11 are programmable to receive an output signal from the RLB directly above the top-bottom I/O pad 111. Another output signal is received from the RLB in the bottom row of the other adjacent RLB column 107.

Routing channel I/O pads 117 are disposed generally along the top and bottom peripheries of the FPGA 11, between the columns 107. The routing channel I/O pads 117 along the top edge are programmable to provide input signals to and receive output signals from the global bus line 407 of the FPSRCs 103. The routing channel pads 117 along the bottom edge are programmable to provide input signals to and receive output signals from the global bus line 407 of the BPSRCs 105.

Side segmented routing channels 115 are disposed adjacent to the left and right peripheries of the FPGA 11. Side segmented routing channels 115, in the preferred embodiment, are identical in structure to the FPSRCs 103 and the BPSRCs 105. All seven bus lines of the side segmented routing channel 115 disposed along the left periphery of the FPGA 11 are connected to the FPSRC input interconnects 155 and the BPSRC output interconnects 181 of the FPRLBs 101 and the BPRLBs 201, respectively, in the left most RLB column 107. All seven bus lines of the side segmented routing channel 115 disposed along the right periphery of the FPGA 11 are connected to the FPSRC output interconnects 161 and the BPSRC input interconnects 175 of the FPRLBs 101 and the BPRLBs 201, respectively, in the right most RLB column 107.

The above description discloses the preferred embodiment of providing input signals to and receiving output signals from FPGA 11. However, it can be appreciated by those skilled in the art that numerous other variations in the placement and operation of the I/O pads are equally effective. For example, the top-bottom I/O pads 111 may be eliminated completely. Thus, the provision of I/O pads to the FPGA 11 may be accomplished other than as specifically described above.

While the preferred embodiment of the invention has been illustrated and described, it will be appreciated that various changes can be made therein without departing from the spirit and scope of the invention. Thus, the invention can be practiced other that as specifically described herein.

The embodiments of the invention in which an exclusive property or privilege is claimed are defined as follows:

1. A field programmable gate array comprising:
    (a) a plurality of forwardly propagating routing and logic blocks (FPRLBs), each of said FPRLBs having means for receiving a plurality of input signals and a plurality of output signals; and
    (b) a plurality of backwardly propagating routing and logic blocks (BPRLBs), each of said BPRLBs having means for receiving said plurality of input signals and said plurality of output signals, said BPRLBs intermeshing with said FPRLBs to form a two-dimensional checkerboard array, wherein the columns of said checkerboard array comprise a plurality of FPRLBs and BPRLBs arranged in alternating sequence and the rows of said checkerboard array comprise a plurality of FPRLBs and BPRLBs arranged in alternating sequence;
    wherein each of said FPRLBs not on the periphery of said checkerboard array is communicatively connected to a plurality of BPRLBs in the same column such that said input signals and said output signals may be passed therebetween, wherein each of said BPRLBs not on the periphery of said checkerboard array is communicatively connected to a plurality of FPRLBs in the same column such that said input signals and said output signals may be passed therebetween, wherein each of said FPRLBs not on the periphery of said checkerboard array is communicatively connected to a plurality of FPRLBs in the immediately adjacent leftward column such that said input signals may be received therefrom and a plurality of FPRLBs in the immediately adjacent rightward column such that said output signals may be transmitted thereto, and wherein each of said BPRLBs not on the periphery of said checkerboard array is communicatively connected to a plurality of BPRLBs in the immediately adjacent leftward column such that said output signals may be transmitted thereto and a plurality of BPRLBs in the immediately adjacent rightward column such that said input signals may be received therefrom.

2. The apparatus of claim 1, further including a plurality of segmented routing channels, said segmented routing channels disposed between the columns of said checkerboard array, said segmented routing channels for receiving said output signals from and providing said input signals to said FPRLBs and BPRLBs in the columns of said checkerboard array immediately adjacent to the individual said segmented routing channels.

3. The apparatus of claim 2, wherein each of said FPRLBs not on the periphery of said checkerboard array provides said output signals to and receives said input signals from two said BPRLBs in the same column and that are directly adjacent above and below; and
    wherein each of said BPRLBs not on the periphery of said checkerboard array provides said output signals to and receives input signals from two said FPRLBs in the same column and that are directly adjacent above and below.

4. The apparatus of claim 3, wherein each of said FPRLBs not on the periphery of said checkerboard array provides said output signals to two said FPRLBs located in the immediately adjacent rightward column and that are in adjacent rows immediately above and below;
    wherein each of said FPRLBs not on the periphery of said checkerboard array receives said input signals from two said FPRLBs located in the immediately adjacent leftward column and that are in adjacent rows immediately above and below;
    wherein each of said BPRLBs not on the periphery of said checkerboard array provides said output signals to two said BPRLBs located in the immediately adjacent leftward column and that are in adjacent rows immediately above and below; and wherein each of said BPRLBs not on the periphery of said checkerboard array receives said input signals from two said BPRLBs located in the immediately adjacent rightward column and that are in adjacent rows immediately above and below.

5. The apparatus of claim 4, wherein one of said segmented routing channels is disposed between every pair of adjacent columns in said checkerboard array.

6. The apparatus of claim 5, wherein said segmented routing channels include a forwardly propagating segmented routing channel (FPSRC) and a backwardly propagating segmented routing channel (BPSRC);
    said FPSRC for receiving said output signals from said FPRLBs in the immediately adjacent leftward column and providing said input signals to said FPRLBs in the immediately adjacent rightward column; and
    said BPSRC for receiving said output signals from said BPRLBs in the immediately adjacent rightward column and providing said input signals to said BPRLBs in the immediately adjacent leftward column.

7. The apparatus of claim 6, wherein both said FPSRCs and said BPSRCs include a plurality of separate segmented bus lines.

8. The apparatus of claim 7, wherein said FPSRCs include seven bus lines:
    two short bus lines, said two short bus lines receiving said output signals from four consecutive said FPRLBs in the immediately adjacent leftward column and providing said input signals to four consecutive said FPRLBs in the immediately adjacent rightward column;
    two medium bus lines, said medium bus lines receiving said output signals from eight said FPRLBs in the immediately adjacent leftward column and providing said input signals to eight consecutive said FPRLBs in the immediately adjacent rightward column;
    two long bus lines, said long bus lines receiving said output signals from sixteen said FPRLBs in the immediately adjacent leftward column and providing said input signals to sixteen consecutive said FPRLBs in the immediately adjacent rightward column; and
    a global bus line receiving said output signals from all of said FPRLBs in the immediately adjacent leftward column and providing said input signals to all of said FPRLBs in the immediately adjacent rightward column.

9. The apparatus of claim 7, wherein said BPSRCs include seven bus lines:
    two short bus lines, said two short bus lines receiving said output signals from four consecutive said BPRLBs in the immediately adjacent rightward column and providing said input signals to four consecutive said BPRLBs in the immediately adjacent leftward column;
    two medium bus lines, said medium bus lines receiving said output signals from eight said BPRLBs in the immediately adjacent rightward column and providing said input signals to eight consecutive said BPRLBs in the immediately adjacent leftward column;
    two long bus lines, said long bus lines receiving said output signals from sixteen said BPRLBs in the immediately adjacent rightward column and providing said input signals to sixteen consecutive said BPRLBs in the immediately adjacent leftward column; and
    a global bus line receiving said output signals from all of said BPRLBs in the immediately adjacent rightward column and providing said input signals to all of said BPRLBs in the immediately adjacent leftward column.

10. The apparatus of claim 8, wherein said BPSRCs include seven bus lines:
    two short bus lines, said two short bus lines receiving said output signals from four consecutive said BPRLBs in the immediately adjacent rightward column and providing said input signals to four consecutive said BPRLBs in the immediately adjacent leftward column;
    two medium bus lines, said medium bus lines receiving said output signals from eight said BPRLBs in the immediately adjacent rightward column and providing said input signals to eight consecutive said BPRLBs in the immediately adjacent leftward column;
    two long bus lines, said long bus lines receiving said output signals from sixteen said BPRLBs in the immediately adjacent rightward column and providing said input signals to sixteen consecutive said BPRLBs in the immediately adjacent leftward column; and
    a global bus line receiving said output signals from all of said BPRLBs in the immediately adjacent rightward column and providing said input signals to all of said BPRLBs in the immediately adjacent leftward column.

11. The apparatus of claim 10, wherein said FPSRCs and said BPSRCs share at least one bus line.

12. The apparatus of claim 2, wherein one of said segmented routing channels is disposed between every pair of adjacent columns in said checkerboard array.

13. The apparatus of claim 12, wherein said segmented routing channels include a forwardly propagating segmented routing channel (FPSRC) and a backwardly propagating segmented routing channel (BPSRC);
    said FPSRC for receiving said output signals from said FPRLBs in the immediately adjacent leftward column and providing said input signals to said FPRLBs in the immediately adjacent rightward column; and
    said BPSRC for receiving said output signals from said BPRLBs in the immediately adjacent rightward column and providing said input signals to said BPRLBs in the immediately adjacent leftward column.

14. The apparatus of claim 13, wherein both said FPSRCs and said BPSRCs include a plurality of separate segmented bus lines.

15. The apparatus of claim 14, wherein said FPSRCs include seven bus lines:
    two short bus lines, said two short bus lines receiving said output signals from four consecutive said FPRLBs in the immediately adjacent leftward column and providing said input signals to four consecutive said FPRLBs in the immediately adjacent rightward column;
    two medium bus lines, said medium bus lines receiving said output signals from eight said FPRLBs in the immediately adjacent leftward column and providing said input signals to eight consecutive said FPRLBs in the immediately adjacent rightward column;

two long bus lines, said long bus lines receiving said output signals from sixteen said FPRLBs in the immediately adjacent leftward column and providing said input signals to sixteen consecutive said FPRLBs in the immediately adjacent rightward column; and a global bus line receiving said output signals from all of said FPRLBs in the immediately adjacent leftward column and providing said input signals to all of said FPRLBs in the immediately adjacent rightward column.

16. The apparatus of claim 14, wherein said BPSRCs include seven bus lines:

two short bus lines, said two short bus lines receiving said output signals from four consecutive said BPRLBs in the immediately adjacent rightward column and providing said input signals to four consecutive said BPRLBs in the immediately adjacent leftward column;

two medium bus lines, said medium bus lines receiving said output signals from eight said BPRLBs in the immediately adjacent rightward column and providing said input signals to eight consecutive said BPRLBs in the immediately adjacent leftward column;

two long bus lines, said long bus lines receiving said output signals from sixteen said BPRLBs in the immediately adjacent rightward column and providing said input signals to sixteen consecutive said BPRLBs in the immediately adjacent leftward column; and a global bus line receiving said output signals from all of said BPRLBs in the immediately adjacent rightward column and providing said input signals to all of said BPRLBs in the immediately adjacent leftward column.

17. The apparatus of claim 15, wherein said BPSRCs include seven bus lines:

two short bus lines, said two short bus lines receiving said output signals from four consecutive said BPRLBs in the immediately adjacent rightward column and providing said input signals to four consecutive said BPRLBs in the immediately adjacent leftward column;

two medium bus lines, said medium bus lines receiving said output signals from eight said BPRLBs in the immediately adjacent rightward column and providing said input signals to eight consecutive said BPRLBs in the immediately adjacent leftward column;

two long bus lines, said long bus lines receiving said output signals from sixteen said BPRLBs in the immediately adjacent rightward column and providing said input signals to sixteen consecutive said BPRLBs in the immediately adjacent leftward column; and a global bus line receiving said output signals from all of said BPRLBs in the immediately adjacent rightward column and providing said input signals to all of said BPRLBs in the immediately adjacent leftward column.

18. The apparatus of claim 17, wherein said FPSRCs and said BPSRCs share at least one bus line.

19. The apparatus of claim 2, wherein said FPRLBs and said BPRLBs are programmable to provide said output signals as a logic function of said input signals; and wherein said FPRLBs and said BPRLBs are programmable to route said input signals that are received to other said FPRLBs and said BPRLBs.

20. The apparatus of claim 19, wherein said FPRLBs and said BPRLBs are of identical internal structure, said FPRLBs and said BPRLBs including multiplexing means for selecting three signals from said input signals received by said FPRLBs and BPRLBs, said FPRLBs and said BPRLBs including a function block for calculating said logic function, said three selected signals provided to said function block.

21. The apparatus of claim 4, wherein said FPRLBs and said BPRLBs are programmable to provide said output signals as a logic function of said input signals; and wherein said FPRLBs and said BPRLBs are programmable to route said input signals that are received to other said FPRLBs and said BPRLBs.

22. The apparatus of claim 21, wherein said FPRLBs and said BPRLBs are of identical internal structure, said FPRLBs and said BPRLBs including multiplexing means for selecting three signals from said input signals received by said FPRLBs and BPRLBs, said FPRLBs and said BPRLBs including a function block for calculating said logic function, said three selected signals provided to said function block.

23. The apparatus of claim 2, further including a plurality of I/O pads disposed along the side periphery of said field programmable gate array, said I/O pads for receiving said output signals from and providing said input signals to the FPRLBs and BPRLBs disposed in the left most and right most columns of said checkerboard array.

24. The apparatus of claim 23, further including a plurality of routing channel I/O pads disposed along the top and bottom periphery of said checkerboard array, said I/O pads for providing said input signals to and receiving output signals from said segmented routing channels.

25. The apparatus of claim 24, further including a plurality of top-bottom I/O pads disposed along the top and bottom periphery of said checkerboard array for providing said input signals to and receiving said output signals from said FPRLBs and BPRLBs disposed in the top most and bottom most rows of said checkerboard array.

26. A field programmable gate array comprising:
(a) a plurality of forwardly propagating routing and logic blocks (FPRLBs), each of said FPRLBs having means for receiving a plurality of input signals and a plurality of output signals;
(b) a plurality of backwardly propagating routing and logic blocks (BPRLBs), each of said BPRLBs having means for receiving said plurality of input signals and said plurality of output signals, said BPRLBs intermeshing with said FPRLBs to form a two-dimensional checkerboard array such that the columns of said checkerboard array comprise said FPRLBs and said BPRLBs arranged in alternating sequence and the rows of said checkerboard array comprise said FPRLBs and said BPRLBs arranged in alternating sequence; and
(c) a plurality of segmented routing channels, one of said segmented routing channels disposed between every pair of adjacent columns of said checkerboard array, said segmented routing channels for receiving said output signals from and providing said input signals to said FPRLBs and BPRLBs in the columns of said checkerboard array adjacent to the individual said segmented routing channels;

wherein each of said FPRLBs not on the periphery of said checkerboard array provides said output signals to and receives said input signals from two said BPRLBs in the same column and that are immediately adjacent above and below;

wherein each of said BPRLBs not on the periphery of said checkerboard array provides said output signals to and receives input signals from two said FPRLBs in the same column and that are immediately adjacent above and below;

wherein each of said FPRLBs not on the periphery of said checkerboard array provides said output signals to two said FPRLBs located in the immediately adjacent rightward column and that are in adjacent rows immediately above and below;

wherein each of said FPRLBs not on the periphery of said checkerboard array receives said input signals from two said FPRLBs located in the immediately adjacent leftward column and that are in adjacent rows immediately above and below;

wherein each of said BPRLBs not on the periphery of said checkerboard array provides said output signals to two said BPRLBs located in the immediately adjacent leftward column and that are in adjacent rows immediately above and below; and wherein each of said BPRLBs not on the periphery of said checkerboard array receives said input signals from two said BPRLBs located in the immediately adjacent rightward column and that are in adjacent rows immediately above and below.

27. The apparatus of claim 26, wherein said segmented routing channels include a forwardly propagating segmented routing channel (FPSRC) and a backwardly propagating segmented routing channel (BPSRC);

said FPSRC for receiving said output signals from said FPRLBs in the immediately adjacent leftward column and providing said input signals to said FPRLBs in the immediately adjacent rightward column; and said BPSRC for receiving said output signals from said BPRLBs in the immediately adjacent rightward column and providing said input signals to said BPRLBs in the immediately adjacent leftward column.

28. The apparatus of claim 27, wherein both said FPSRCs and said BPSRCs include a plurality of separate segmented bus lines.

* * * * *

UNITED STATES PATENT AND TRADEMARK OFFICE
CERTIFICATE OF CORRECTION

PATENT NO. : 5,208,491
DATED : May 4, 1993
INVENTOR(S) : W.H.C. Ebeling et al.

It is certified that error appears in the above-indentified patent and that said Letters Patent is hereby corrected as shown below:

Column 1, line 5, insert new paragraph:

--This invention was made with government support under Grant CCR-8657589 awarded by the National Science Foundation. The government has certain rights in the invention.--

Signed and Sealed this

Sixth Day of September, 1994

Attest:

BRUCE LEHMAN

Attesting Officer

Commissioner of Patents and Trademarks